United States Patent
Julien

(10) Patent No.: US 12,525,959 B2
(45) Date of Patent: Jan. 13, 2026

(54) TRACKING CIRCUIT FOR TRACKING A FREQUENCY OF A SWEEPING SIGNAL COMPONENT IN AN INPUT SIGNAL, FILTER CIRCUIT AND METHOD FOR PROCESSING A SWEEPING SIGNAL COMPONENT IN AN INPUT SIGNAL

(71) Applicant: u-blox AG, Thalwil (CH)

(72) Inventor: Olivier Julien, Thalwil (CH)

(73) Assignee: u-blox AG, Thalwil (CH)

( * ) Notice: Subject to any disclaimer, the term of this patent is extended or adjusted under 35 U.S.C. 154(b) by 0 days.

(21) Appl. No.: 18/641,111

(22) Filed: Apr. 19, 2024

(65) Prior Publication Data

US 2024/0364311 A1  Oct. 31, 2024

(30) Foreign Application Priority Data

Apr. 27, 2023 (EP) ..................................... 23170319

(51) Int. Cl.
*H03H 11/04* (2006.01)
*H03K 5/00* (2006.01)
(Continued)

(52) U.S. Cl.
CPC .............. *H03H 11/04* (2013.01); *H04B 1/10* (2013.01); *H03H 2011/0488* (2013.01); *H03K 2005/00078* (2013.01); *H03K 5/01* (2013.01)

(58) Field of Classification Search
CPC .. H03H 11/04; H03H 2011/0488; H03H 7/30; H04B 1/10; H04B 1/1036;
(Continued)

(56) References Cited

U.S. PATENT DOCUMENTS

2020/0309933 A1* 10/2020 Ray .................... G01S 13/282
2025/0116782 A1*  4/2025 Meshcheryakov ..... G01S 19/36

FOREIGN PATENT DOCUMENTS

CN          104518786          4/2015

OTHER PUBLICATIONS

Extended European Search Report in European Appln. No. 23170319.0, mailed on Nov. 9, 2023, 10 pages.
(Continued)

*Primary Examiner* — David S Huang
(74) *Attorney, Agent, or Firm* — Fish & Richardson P.C.

(57) ABSTRACT

In one embodiment a tracking circuit for tracking a frequency of a sweeping signal component in an input signal comprises an input for receiving the input signal (Sin) comprising the sweeping signal component and a noise component, a mixer coupled to the input and configured to mix the input signal with a replica signal and therefrom provide a residual input signal, a low-pass filter coupled downstream of the mixer, a discriminator circuit coupled downstream of the low-pass filter, a loop filter coupled downstream of the discriminator circuit and configured to provide a frequency control value, and a replica signal generator circuit coupled downstream of the loop filter and configured to provide the replica signal with a frequency adjusted based on the frequency control value, wherein the frequency of the replica signal represents an estimation of a frequency of the sweeping signal component propagated to a current time unit of the input signal.

18 Claims, 3 Drawing Sheets

(51) Int. Cl.
*H03K 5/01* (2006.01)
*H04B 1/10* (2006.01)

(58) Field of Classification Search
CPC ...................... H03K 5/01; H03K 2005/00078; G01S 19/21; H03L 7/16
See application file for complete search history.

(56) References Cited

OTHER PUBLICATIONS

Gamba et al., "Performance Analysis of FLL Schemes to Track Swept Jammers in an Adaptive Notch Filter," 2018 9th ESA Workshop on Satellite Navigation Technologies and European Workshop on GNSS Signals and Signal Processing (NAVITEC), Noordwijk, Netherlands, Dec. 5-7, 2018, 8 pages.

Kang et al., "A Novel Detection and Tracking Algorithm of Chirp Type Civilian GNSS Interference," 26th International Technical Meeting of the Satellite Division of The Institute of Navigation (ION), Nashville, Tennessee, USA, Sep. 16-20, 2013, pp. 2910-2915.

* cited by examiner

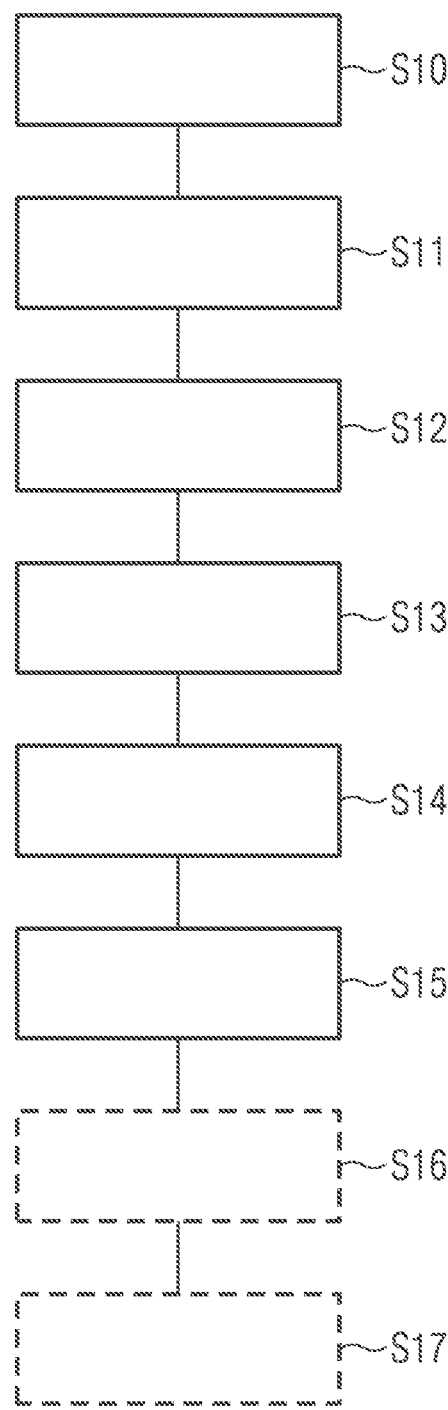

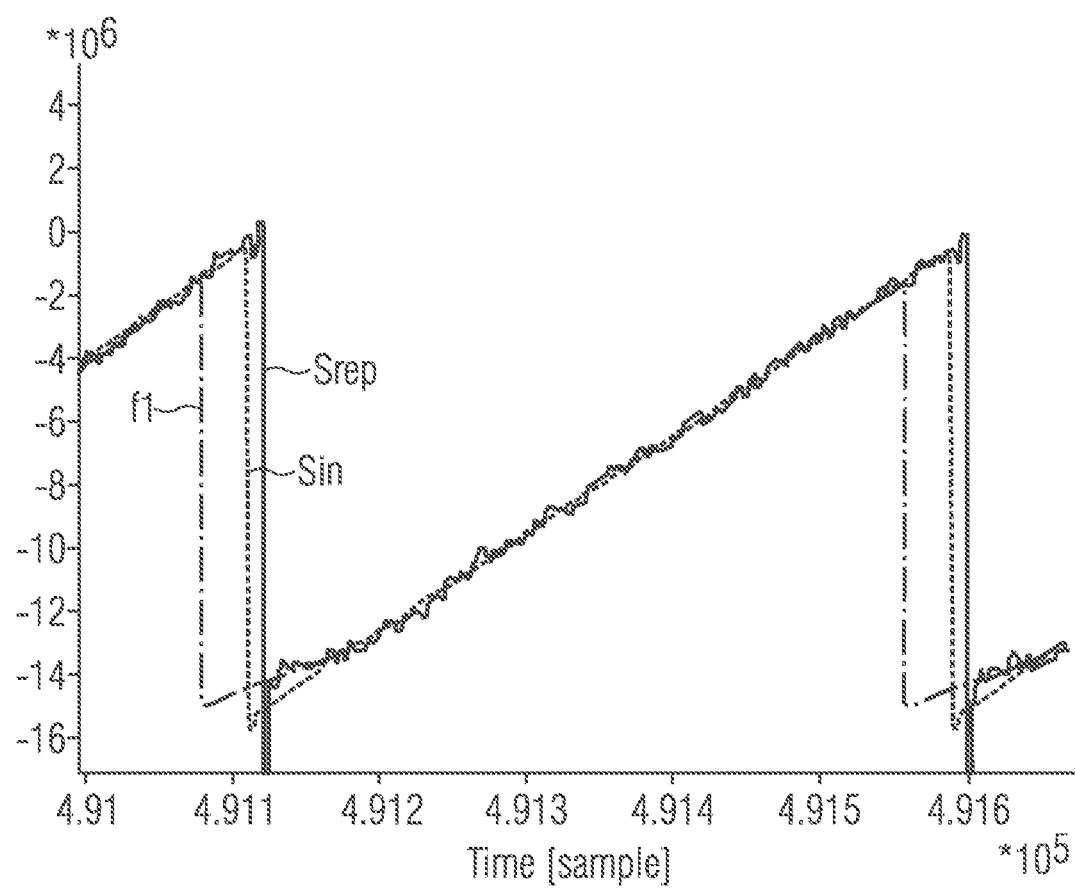

TRACKING CIRCUIT FOR TRACKING A FREQUENCY OF A SWEEPING SIGNAL COMPONENT IN AN INPUT SIGNAL, FILTER CIRCUIT AND METHOD FOR PROCESSING A SWEEPING SIGNAL COMPONENT IN AN INPUT SIGNAL

CROSS-REFERENCE TO RELATED APPLICATION(S)

This application claims priority to European Application No. 23170319.0 filed on Apr. 27, 2023, the contents of which are incorporated herein by reference in their entirety.

TECHNICAL FIELD

The present disclosure relates to the field of wireless communication, especially to the task of tracking radio frequency signals. Specifically, the disclosure is directed to a tracking circuit for tracking a frequency of a sweeping signal component in an input signal, a filter circuit and a method for processing a sweeping signal component in an input signal.

BACKGROUND

In the field of wireless communication, involved devices use increasingly complex receiver circuits to take account of ever more functionality and high data rates, for example. Such receivers may be employed in various electronic devices, like mobile phones or Global Navigation Satellite Signal devices. In each case, a radio frequency, RF, signal having well-defined-often standardized-characteristics forms the basis for transmission of information. Receivers for RF signals ensure successful receipt of the transmitted signal for enabling correct decoding of the conveyed information. In this regard, it may be desirable to track certain components of the received signal. Especially, a frequency of such components has to be identified and followed.

A received signal may have besides a wanted signal component, which comprises the conveyed information-a noise component and a sweeping signal component. Said sweeping signal component may result from interference which often affects wireless signal transmission. Interference refers to undesired electromagnetic energy, which influences functioning of electronic systems.

Such a sweeping signal component may change its frequency with a certain rate. In some cases, this so-called sweeping rate is high, such that a frequency range of the wanted signal component is passed fast, so that it is difficult to tackle, i.e., track and possibly eliminate, said sweeping signal from a received signal. What is more, the sweeping signal component may be drowned in the noise component, i.e., may have a negative Signal-to-Noise ratio, SNR, which renders tracking of the sweeping signal component even more challenging.

A frequency-locked loop, FLL, may be employed for tracking a frequency of a signal component in a received signal. However, when it comes to tracking a fast sweeping and weak signal, known FLLs fail to complete the task.

An objective could therefore be seen in providing a solution which enables tracking a fast sweeping weak signal component.

The objective is achieved by the subject-matter of the independent claims. Embodiments and developments are defined in the dependent claims.

The definitions provided above also apply to the following description unless stated otherwise.

SUMMARY

In one embodiment a tracking circuit for tracking a frequency of a sweeping signal component in an input signal comprises an input for receiving the input signal, a mixer, a low-pass filter, a discriminator circuit, a loop filter and a replica signal generator circuit. The input signal comprises the sweeping signal component and a noise component. The mixer is coupled to the input and is configured to mix the input signal with a replica signal and therefrom provide a residual input signal. The low-pass filter is coupled downstream of the mixer and is configured to reduce the noise component from the residual input signal and therefrom provide a filtered input signal. The discriminator circuit is coupled downstream of the low-pass filter and is configured to estimate a frequency error of the filtered input signal and accordingly provide an error signal. The loop filter is coupled downstream of the discriminator circuit and is configured to provide a frequency control value based on the error signal. The replica signal generator circuit is coupled downstream of the loop filter and is configured to provide the replica signal with a frequency adjusted based on the frequency control value. Therein, the frequency of the replica signal represents an estimation of a frequency of the sweeping signal component propagated to a current time unit of the input signal.

The tracking circuit tracks or follows the frequency of the sweeping signal component of the input signal in a loop which comprises the mixer, the low-pass filter, the discriminator circuit, the loop filter and the replica signal generator circuit. By mixing the input signal, e.g., a radio frequency signal, with the replica signal, the residual input signal is obtained, which in case of an RF input signal may conform to the input signal shifted to baseband frequency region. In the low pass filter the noise component is reduced or even removed from the residual input signal. Consequently, the filtered input signal mainly comprises the sweeping signal component. The discriminator circuit subsequently extracts an estimate of the frequency error or the frequency tracking error of the filtered input signal. The subsequent loop filter removes noise from the error signal and provides the frequency control value which indicates a difference, i.e., increment or decrement, to the previous estimation of the frequency of the sweeping signal component. The frequency control value represents a current estimation of the frequency of the sweeping signal component for generating the replica signal. The frequency of the generated replica signal conforms to the estimation of the frequency of the sweeping signal component propagated to the current time unit of the input signal.

By means of the proposed tracking circuit, the frequency of the sweeping signal component in the input signal can be tracked, even in the case that the sweeping rate is high, because of the propagation of the estimation of the frequency of the sweeping signal component to the current time unit of the input signal. Consequently, a lag in time introduced by the low-pass filter, which is necessary to remove the noise in the input signal, is compensated for in the tracking circuit and the sweeping signal component can be properly tracked. In comparison, in a state-of-the-art tracking loop, the loop filter or the order of the loop may be adjusted, for instance. However, it has been found that these mechanisms are not sufficient, in case the presence of the low-pass filter creates a delay which is significant with respect to the desired reaction time of the loop.

Optionally, the input signal additionally comprises a wanted signal component which comprises the information to be conveyed with said input signal. The sweeping signal component may be a useful signal, or it may be an interference signal.

According to a development, the sweeping signal component of the input signal is characterized by a varying frequency which increases and/or decreases. Optionally, the sweeping signal component may have one or more resets occurring at a special frequency from which the frequency increases or decreases. Such reset events may even occur regularly. A reset in the frequency of the sweeping signal component may also be regarded as a jump in the frequency.

The proposed solution realizes a tracking loop with very fast reaction time, which enables tracking of the sweeping signal component shortly after a reset, even if such resets occur with high frequency.

In a development, a group delay of the low-pass filter is large with respect to a predefined desired response time of the tracking circuit. In particular, the group delay of the low-pass filter is more than ten percent of the predefined desired response time of the tracking circuit.

As stated above, the sweeping signal component may be drowned in or overlaid with the noise component. The low-pass filter is consequently employed to remove or reduce said noise component from the input signal. However, it may introduce a considerable amount of group delay, which cannot be neglected in the case that the frequency of the sweeping signal component varies with high speed. Depending on the use case, the tracking circuit is expected to implement a response time which enables proper tracking of the sweeping signal component. In the case of a fast-sweeping signal component, the response time of the tracking circuit has to be short.

In a development, the low-pass filter is configured to increase a signal-to-noise ratio, SNR, of the residual input signal. In particular, the low-pass filter is configured to increase the SNR of the residual input signal to above five decibel.

As described above, the input signal of the tracking circuit contains a considerable amount of noise, such that the sweeping signal component is drowned in the noise component. The low-pass filter is configured to counteract on this and increase the SNR of the residual input signal within the loop of the tracking circuit.

In a development, the current time unit of the input signal designates a sample of the input signal, which is currently received at the input. The estimation of the frequency of the sweeping signal component propagated to the current time unit of the input signal is based on a group delay of the low-pass filter.

The low-pass filter introduces a significant group delay within the loop of the tracking circuit. This implies that the frequency error, which is estimated in the discriminator circuit, is also delayed by said group delay of the low-pass filter. In order to compensate for this delay, the estimation of the frequency of the sweeping signal component, which is reflected in the replica signal, which in turn is mixed with the input signal, is propagated to the current time unit of said input signal. This ensures fast convergence of the loop implemented by the tracking circuit and reliable tracking of the sweeping signal component.

In a development, the replica signal generator circuit comprises a frequency generator circuit, a prediction circuit and a numerically-controlled-oscillator, NCO. The frequency generator circuit is configured to provide a frequency value using a current frequency control value, wherein the frequency value represents a current estimation of the frequency of the sweeping signal component. The prediction circuit is configured to calculate a first control value reflecting a frequency offset between the frequency value and the frequency of the input signal at the current time unit of the input signal using the current frequency control value and a number of previous frequency control values. The NCO is configured to provide the replica signal according to a second control value. The second control value is a function of the first control value and the frequency value.

The prediction circuit determines by how much the frequency value has changed between the current sample, which is subject to the delay introduced by the low-pass filter, and the current time unit of the input signal. The first control value is provided accordingly. The first control value is combined with the frequency value, resulting in the second control value. The NCO generates the replica signal using the second control value. From the viewpoint of a current sample of the input signal which is received at the input at the current time unit of the input signal, the frequency value represents the estimation of the frequency of the sweeping signal component at some point in the past due to the delay introduced by the low-pass filter. The prediction circuit consequently determines or estimates by how much the frequency of the sweeping signal component has changed in the meantime and accordingly provides the first control value. The frequency value is then propagated to the current time using this first control value, which gives the second control value. Said second control value is used in the NCO to provide the replica signal.

In a development, the prediction circuit is configured to provide the first control value by estimating a slope of the frequency of the input signal using the current frequency control value and the number of previous frequency control values and multiplying it by the group delay of the low-pass filter.

The first control value is consequently determined based on the current frequency control value and the number of previous frequency control values and multiplication with the group delay of the low-pass filter. For example, the last two frequency control values are used. This kind of linear extrapolation of the current frequency control value enables estimation of the slope of the frequency of the input signal, which may be used in the prediction circuit to calculate the first control value for the propagation of the frequency of the replica signal to the current time unit of the input signal.

In one embodiment a filter circuit comprises the tracking circuit as described above, a delay circuit coupled to the input of the tracking circuit and a notch filter circuit which is coupled downstream of the delay circuit. The delay circuit is configured to delay the input signal depending on the group delay of the low-pass filter of the tracking circuit and accordingly provide a delayed input signal. The notch filter circuit is configured to reduce a frequency from the delayed input signal and accordingly provide an output signal. Therein the frequency is derived from the frequency control value.

The filter circuit enables filtering or reducing or notching out the frequency from the delayed input signal, this frequency is derived from the frequency control value. By this, the frequency of the sweeping signal component can be reliably removed from the input signal.

In more detail, the tracking circuit tracks the frequency of the sweeping signal component in the input signal. The frequency value derived from the frequency control value may be the frequency value used in the frequency generator circuit within the replica signal generator circuit of the tracking circuit. As explained above, this frequency value represents the current estimation of the frequency of the sweeping signal component which, however, is subject to the delay introduced by the low-pass filter of the tracking circuit. Therefore, the delay circuit of the filter circuit delays the input signal depending on the group delay of the low-pass filter so that the notch filter circuit is enabled to remove the frequency of the sweeping signal component from the input signal at the time unit which corresponds to the time unit for which the frequency value has been provided.

The proposed filter circuit implements reliable tracking and removing of a sweeping signal component in an input signal, even if the sweeping signal component is drowned in noise and sweeps with high speed through the frequency band of the input signal.

The notch filter may be implemented by a notch filter circuit as known to those skilled in the art.

The filter and/or tracking circuit realize the trade-off between implementation complexity of the loop and the low-pass filter, loop reaction time and efficient tracking of fast sweeping signal components. Using a higher order loop is avoided with the described solution. Similarly, a simple low-pass filter is used which reduces resources without reducing the filter bandwidth or its sensitivity. The group delay of the low-pass filter which is the result of this trade-off is compensated for with the tracking circuit and filter circuit as proposed above.

In an embodiment a method for processing a sweeping signal component in an input signal comprises the steps of:
  receiving the input signal comprising a noise component and the sweeping signal component,
  mixing the input signal with a replica signal and therefrom providing a residual input signal,
  reducing the noise component by low-pass filtering the residual input signal and therefrom providing a filtered input signal,
  estimating a frequency error of the filtered input signal and therefrom providing an error signal,
  filtering the error signal and providing a frequency control value,
  generating the replica signal with a frequency adjusted according to the frequency control value.
Therein the frequency of the replica signal represents an estimation of a frequency of the sweeping signal component propagated to a current time unit of the input signal.

The method ensures reliable tracking of the sweeping signal component in the input signal because of the use of the replica signal, which represents an estimation of the sweeping signal component with a frequency which is adapted to match the current time unit of the input signal.

In a development generating the replica signal comprises:
  generating a frequency value using a current frequency control value, wherein the frequency value represents a current estimation of the frequency of the sweeping signal component,
  calculating a first control value using the current frequency control value and a number of previous frequency control values, wherein the first control value reflects a frequency offset between the frequency value and the frequency of the input signal at the current time unit of the input signal,
  adjusting the frequency and optionally the phase of the replica signal based on a second control value, the second control value being a function of the first control value and the frequency value.

Based on the current estimation of the frequency of the sweeping signal component, i.e., the frequency value, and a number of previous frequency control values, the first control value is calculated. This value forms the basis for the second control value, which is subsequently used in adjusting the frequency and possibly the phase of the replica signal. By this, the lag introduced by the low-pass filter is compensated and the frequency of the replica signal is adapted such that it suits in time the time unit of the currently received sample of the input signal.

In a development, the current time unit of the input signal designates a sample of the input signal, which is currently received. The current frequency control value designates the frequency control value derived from a said sample of the input signal.

In a development, the method further comprises the steps:
  delaying the input signal according to a delay time of the low-pass filtering and therefrom providing a delayed input signal,
  filtering the delayed input signal based on the frequency value thereby reducing the sweeping signal component, and accordingly providing an output signal.

Due to the reliable tracking of the sweeping signal component combined with an adapted delay of the input signal, said component can be filtered out from the input signal almost completely.

BRIEF DESCRIPTION OF THE DRAWINGS

The text below explains the proposed solution in detail using exemplary embodiments with reference to the drawings. Components and elements that are functionally identical or have an identical effect bear identical reference numbers. Insofar as parts or components correspond to one another in their function, a description of them will not be repeated in each of the following figures.

FIG. 2 shows an exemplary embodiment of a method for processing a sweeping signal component in an input signal as proposed, and FIG. 3 shows exemplary signal diagrams for the tracking circuit depicted in FIG. 1.

DETAILED DESCRIPTION

Figure 1:
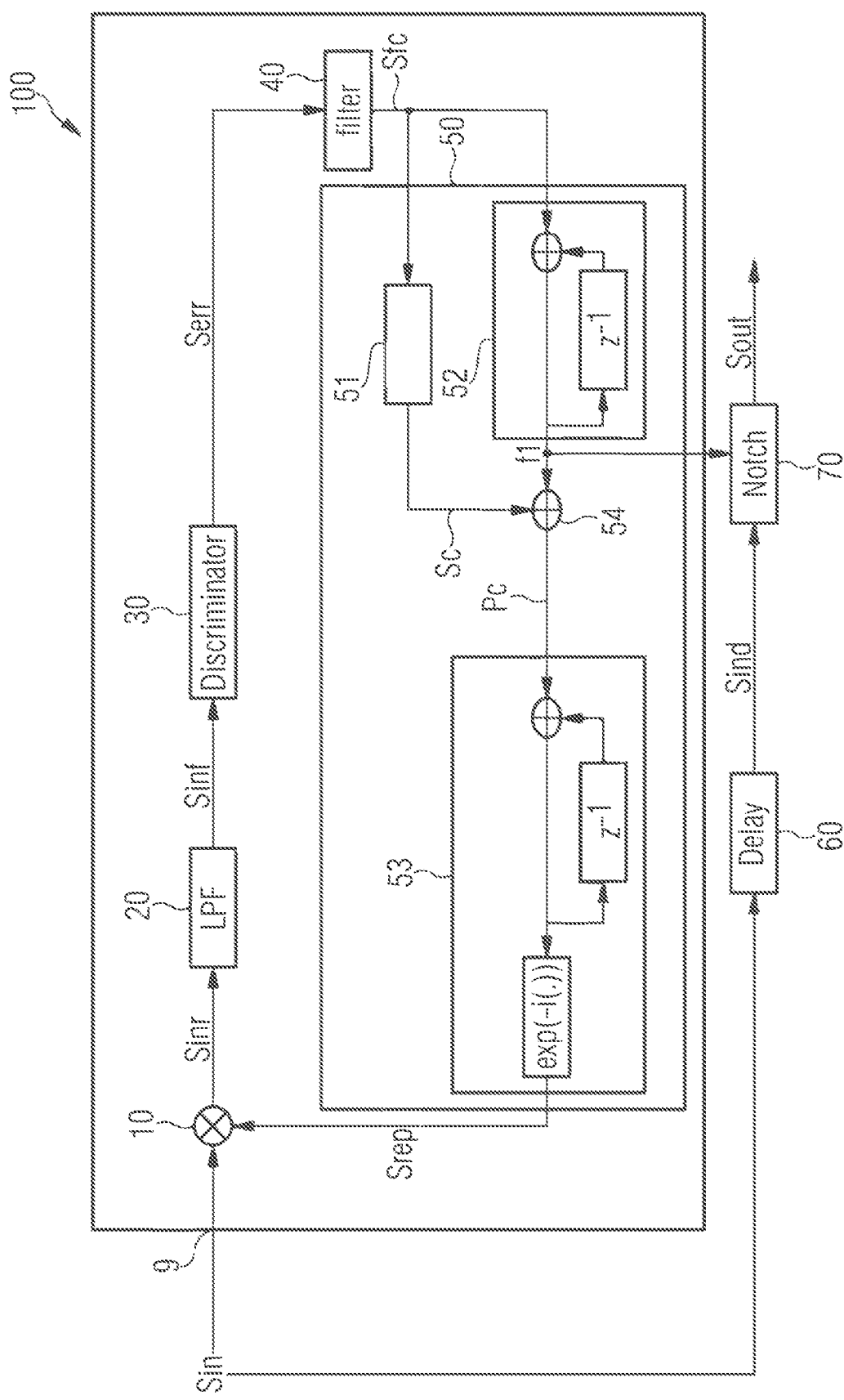
FIG. 1 shows an exemplary embodiment of the filter circuit comprising the tracking circuit for tracking a frequency of a sweeping signal component in an input signal as proposed.

FIG. 1 shows an exemplary embodiment of the filter circuit comprising the tracking circuit for tracking a frequency of a sweeping signal component in an input signal as proposed. The tracking circuit 100 comprises an input 9 for receiving the input signal Sin, a mixer 10, a low-pass filter 20, a discriminator circuit 30, a loop filter 40 and a replica signal generator circuit 50. The components of the tracking circuit 100 are coupled in a loop. In detail, the mixer 10 is coupled to the input 9 and is configured to provide a residual input signal Sinr from mixing the input signal Sin with a replica signal Srep. The low-pass filter 20, which is coupled downstream of the mixer 10, receives the residual input signal Sinr and is configured to reduce the noise component from said residual input signal Sinr. The low-pass filter 20 consequently provides a filtered input signal Sinf. The discriminator circuit 30 receives the filtered input signal Sinf and, based on that signal, estimates a frequency error as known to the skilled person and therefrom provides an error signal Serr. For implementing the discriminator circuit 30, a state-of-the-art differential arctangent or the cross-product discriminator may be used. The loop filter 40 which is coupled downstream of the discriminator circuit 30 receives the error signal Serr, which is filtered, e.g., noise is removed from the error signal Serr, and provides a frequency control value Sfc based on said error signal Serr. The replica signal generator circuit 50 is coupled to an output of the loop filter 40 and to an input of the mixer 10, thereby closing the loop. The replica signal generator circuit 50 receives the frequency control value Sfc and provides the replica signal Srep with a frequency adjusted based on the frequency control value Sfc. The frequency of the replica signal Srep represents an estimation of the frequency of the sweeping signal component propagated to a current time unit of the input signal Sin.

The input signal Sin comprises the sweeping signal component and a noise component. Said input signal Sin may further comprise a wanted signal component which has the information to be transmitted with the radio frequency signal Sin. In an exemplary implementation, the input signal Sin comprises a signal sent by a global navigation satellite system, GNSS, satellite, which enables a device receiving said signal Sin to determine its position. In another exemplary implementation the input signal Sin comprises an RF signal according to a wireless communication as defined in standards of the 3GPP.

In a scenario, which is especially highlighted in the present application, the sweeping signal component shall be tracked to be removed from the input signal Sin. Furthermore, in this scenario, the frequency of the sweeping signal component varies fast, for example at 4 MHz/μs and consequently sweeps quickly through the band of the input signal Sin, for instance a GNSS signal with a bandwidth of 2 to 20 MHz. Compared to the noise component of the input signal Sin, the sweeping signal component has much less power, but still harms correct reception and decoding of the input signal Sin. Therefore, the low-pass filter 20 is inserted in the loop of the tracking circuit.

In the application scenario of a GNSS signal which represents the input signal Sin, the input signal comprises the sweeping signal component, which may represent an interferer to a wanted signal component, the noise component and the wanted signal component. The input signal Sin may be represented according to the following equation:

$$Sin[k] = A_{CW}[k]\exp(i\varphi_{CW}[k]) + n[k] + s_U[k]$$

Therein, $A_{CW}$, and $\varphi_{CW}$ respectively represent the amplitude and phase of the sweeping signal component, k represents the sample index, n represents the noise component and $s_U$ represents the optional useful signal component. The phase of the sweeping signal component varies according to the instantaneous frequency $f_{CW}$ of that component.

After the mixer 10, the residual input signal Sinr in that case basically comprises a residual carrier in a baseband frequency range. This carrier is however drowned in noise of the noise component. The low-pass filter 20 reduces or removes said noise component and provides the filtered input signal Sinf. Due to the usage of a narrow and simple filter for the low-pass filter 20, a considerable group delay is introduced into the signal path of the loop. The filtered input signal Sinf in the described scenario of a GNSS input signal Sin comprises the carrier formed from a weighted sum of the history of the residual carrier provided with the residual input signal Sinr.

The discriminator circuit 30 extracts an estimate of the frequency tracking error, which approximately amounts to the difference between the sweeping signal component and the replica signal Srep. Due to the filtering effect of the low-pass filter circuit 20 as described above, the frequency error provided with the error signal Serr represents the frequency error a certain amount of time in the past. This certain amount of time may be the group delay of the low-pass filter 20. The loop filter 40 provides the frequency control value Sfc based on the error signal Serr. This basically represents a delta frequency, i.e., an increment or a decrement with respect to the current frequency of the input signal Sin. In order to enable proper tracking of the sweeping signal component in the input signal Sin despite the delay introduced by the low-pass filter 20, the replica signal generator circuit 50 realizes a propagation of the frequency control value Sfc from the time used in the discriminator circuit 30 to the current time unit of the input signal Sin. This enables the loop of the tracking circuit to converge on time, for example in a few microseconds, allowing tracking of the sweeping signal component, even if it sweeps with a high speed.

The replica signal Srep may be represented by the following equation:

$$\exp(-i\phi[k])$$

Therein, $\phi$ represents the phase of the replica signal Srep and k represents the sample index.

In order to fulfill the propagation task, the replica signal generator circuit 50 comprises a frequency generator circuit 52, a prediction circuit 51, an NCO 53 and a combiner 54. The frequency generator circuit 52 receives the current frequency control value Sfc and, based on said value Sfc, provides a frequency value f1, which represents a current estimation of the frequency of the sweeping signal component. The frequency estimated with this frequency value f1 is also suffering from the lag or delay introduced by the low-pass filter 20 and therefore represents an estimate "in the past". The prediction circuit 51 also receives the frequency control value Sfc and calculates a first control value Sc based on the current frequency control value Sfc and a number of previous frequency control values Sfc that it has stored during previous runs of the loop of the tracking circuit. The first control value Sc reflects a frequency offset between the frequency value f1 which reflects the delay of the low-pass filter 20, and the frequency of the input signal Sin at the current time unit of the input signal Sin, i.e. the sample of the input signal Sin currently received at the input 9.

In an implementation example, the prediction circuit 51 models the frequency slope of the input signal using past frequency control values Sfc and propagates this model to the current sample of the input signal Sin. For the propagation linear extrapolation may be used based on at least two previous frequency control values Sfc and multiplication with the group delay of the low-pass filter 20. The first control value Sc is combined with the frequency value f1 in combiner 54, e.g., by adding the first control value Sc and the frequency value f1, which results in the second control value Pc, which is used to control the NCO 53. The NCO 53, e.g., a state-of-the-art NCO, accordingly, provides the replica signal Srep with adjusted frequency and phase using the second control value Pc. Consequently, the replica signal Srep comprises a frequency that has been propagated forward by the replica signal generator circuit 50 to the current time unit of the input signal Sin. By this, proper tracking of the sweeping signal component of the input signal Sin is enabled.

The filter circuit depicted in FIG. 1 comprises the tracking circuit 100 as described above and a delay circuit 60, as well as a notch filter circuit 70. The delay circuit 60 is coupled to the input 9 of the tracking circuit 100. The notch filter circuit 70 is coupled downstream of the delay circuit 60. The delay circuit 60 delays the input signal Sin depending on the group delay of the low-pass filter 20 of the tracking circuit 100 and accordingly provides a delayed input signal Sind. The notch filter circuit 70 reduces a frequency from the delayed input signal Sind and therefrom provides an output signal Sout. The frequency which is removed from the delayed input signal Sind is derived from the frequency control value Sfc used in the tracking circuit 100. In the depicted example, said frequency is the frequency value f1 which represents the current estimation of the frequency of the sweeping signal component.

Based on the proper tracking of the sweeping signal component in the input signal Sin, said sweeping signal component may be removed from the input signal Sin nearly completely. The group delay inserted by the low-pass filter 20 is compensated inside the tracking circuit 100 as well as in the proposed filter circuit, such that the sweeping signal component is mostly removed. In the scenario of a GNSS signal which is received with the input signal Sin which also contains a wanted signal component or a component of interest, the output signal Sout which is provided by the proposed filter circuit mainly contains the wanted signal component in baseband frequency range.

With the proposed filter circuit using the proposed tracking circuit 100 a fast sweeping but weak signal component can be tracked in a reliable way and subsequently removed from the supplied input signal.

FIG. 2 shows an exemplary embodiment of a method for processing a sweeping signal component in a input signal. The method comprises the following steps:
- S10: receiving the input signal Sin comprising a noise component and the sweeping signal component,
- S11: mixing the input signal Sin with a replica signal Srep and therefrom providing a residual input signal Sinr,
- S12: reducing the noise component by low-pass filtering the residual input signal Sinr and therefrom providing a filtered input signal Sinf,
- S13: estimating a frequency error of the filtered input signal Sinf and therefrom providing an error signal Serr,
- S14: filtering the error signal Serr and providing a frequency control value Sfc,
- S15: generating the replica signal Srep with the frequency adjusted according to the frequency control value Sfc, wherein the frequency of the replica signal Srep represents an estimation of a frequency of the sweeping signal component propagated to a current time unit of the input signal Sin.

Optionally, the method further comprises the steps of:
- S16: delaying the input signal Sin according to a delay time of the low-pass filter and therefrom providing a delayed input signal Sind,
- S17: filtering the delayed input signal Sind based on the frequency value f1, thereby reducing the sweeping signal component, and accordingly providing an output signal Sout.

The method may be implemented by the tracking circuit 100 and the filter circuit, respectively, described above and as depicted in FIG. 1, for example.

FIG. 3 shows exemplary signal diagrams for the tracking circuit depicted in FIG. 1. Samples processed in simulations by the tracking circuit are depicted on the X-axis, while the corresponding frequency is depicted on the Y-axis. The replica signal Srep, the true frequency of the sweeping interference component that comes with input signal Sin and the frequency value f1 are shown. Note that for the purpose of this figure only, the shown frequency f1 has been aligned in time with the input signal Sin by advancing it by the magnitude of the delay of the delay circuit 60.

It can be discerned that the frequency of the sweeping component in the input signal Sin is properly tracked, even if it is noisy, by the replica signal Srep and the frequency value f1.

Although a GNSS scenario was used in the above to explain the present invention, the concept claimed may be applied to any application scenario which is susceptible to a fast-moving interferer or jammer.

It will be appreciated that the invention is not limited to the disclosed embodiments and to what has been particularly shown and described hereinabove. Rather, features recited in separate dependent claims or in the description may advantageously be combined. Furthermore, the scope of the invention includes those variations and modifications which will be apparent to those skilled in the art and fall within the scope of the appended claims. The term "comprising" used in the claims or in the description does not exclude other elements or steps of a corresponding feature or procedure. In the case that the terms "a" or "an" are used in conjunction with features, they do not exclude a plurality of such features. Moreover, any reference signs in the claims should not be construed as limiting the scope.

REFERENCE LIST

Sin, Sinr, Sinf, Serr, Srep, signal
Sout, Sind signal
9 input
10 mixer
20 low-pass filter
30 discriminator circuit
40 loop filter
50 generator circuit
51 prediction circuit
52 generator circuit
53 NCO
54 combiner
60 delay circuit
70 notch filter circuit
100 tracking circuit
Sfc, Pc, Sc control value
f1 frequency value
S10, S11, . . . , S17 method step

I claim:

1. A tracking circuit for tracking a frequency of a sweeping signal component in an input signal, the tracking circuit comprising
    an input for receiving the input signal comprising the sweeping signal component and a noise component,
    a mixer coupled to the input and configured to mix the input signal with a replica signal and therefrom provide a residual input signal, a low-pass filter coupled downstream of the mixer and configured to reduce the noise component from the residual input signal and therefrom provide a filtered input signal, a discriminator circuit coupled downstream of the low-pass filter and configured to estimate a frequency error of the filtered input signal and accordingly provide an error signal, a loop filter coupled downstream of the discriminator circuit and configured to provide a frequency control value based on the error signal, a replica signal generator circuit coupled downstream of the loop filter and configured to provide the replica signal with a frequency adjusted based on the frequency control value, wherein the frequency of the replica signal represents an estimation of a frequency of the sweeping signal component propagated to a current time unit of the input signal.

2. The tracking circuit according to claim 1, wherein the sweeping signal component of the input signal has a varying frequency which increases and/or decreases.

3. The tracking circuit according to claim 1, wherein a group delay of the low-pass filter is more than ten percent of a predefined response time of the tracking circuit.

4. The tracking circuit according to claim 1, wherein the low-pass filter is configured to increase a Signal-to-Noise ratio (SNR) of the residual input signal to above 5 dB.

5. The tracking circuit according to claim 1, wherein the current time unit of the input signal designates a sample of the input signal, which is currently received at the input, and wherein the estimation of the frequency of the sweeping signal component propagated to the current time unit of the input signal is based on a group delay of the low-pass filter.

6. The tracking circuit according to claim 1, wherein the replica signal generator circuit comprises:

a frequency generator circuit, which is configured to provide a frequency value using a current frequency control value, wherein the frequency value represents a current estimation of the frequency of the sweeping signal component, a prediction circuit, which is configured to calculate a first control value reflecting a frequency offset between the frequency value and the frequency of the input signal at the current time unit of the input signal using the current frequency control value and a number of previous frequency control values, and a numerically-controlled-oscillator, which is configured to provide the replica signal according to a second control value, the second control value being a function of the first control value and the frequency value.

7. The tracking circuit according to claim 6, wherein the prediction circuit is configured to provide the first control value by estimating a slope of the frequency of the input signal using the current frequency control value and the number of previous frequency control values and multiplying it by a group delay of the low-pass filter.

8. A filter circuit comprising:
the tracking circuit according to claim 1;
a delay circuit coupled to the input of the tracking circuit; and
a notch filter circuit coupled downstream of the delay circuit,
wherein the delay circuit is configured to delay the input signal depending on a group delay of the low-pass filter of the tracking circuit and accordingly provide a delayed input signal, and wherein the notch filter circuit is configured to reduce a frequency from the delayed input signal and accordingly provide an output signal, the frequency being derived from the frequency control value.

9. The filter circuit according to claim 8 wherein the sweeping signal component of the input signal has a varying frequency which increases and/or decreases.

10. The filter circuit according to claim 8 wherein a group delay of the low-pass filter is more than ten percent of a predefined response time of the tracking circuit.

11. The filter circuit according to claim 8 wherein the low-pass filter is configured to increase a Signal-to-Noise ratio (SNR) of the residual input signal to above 5 dB.

12. The filter circuit according to claim 8 wherein the current time unit of the input signal designates a sample of the input signal, which is currently received at the input, and wherein the estimation of the frequency of the sweeping signal component propagated to the current time unit of the input signal is based on a group delay of the low-pass filter.

13. The filter circuit according to claim 8 wherein the replica signal generator circuit comprises:

a frequency generator circuit, which is configured to provide a frequency value using a current frequency control value, wherein the frequency value represents a current estimation of the frequency of the sweeping signal component, a prediction circuit, which is configured to calculate a first control value reflecting a frequency offset between the frequency value and the frequency of the input signal at the current time unit of the input signal using the current frequency control value and a number of previous frequency control values, and a numerically-controlled-oscillator, which is configured to provide the replica signal according to a second control value, the second control value being a function of the first control value and the frequency value.

14. The filter circuit according to claim 13 wherein the prediction circuit is configured to provide the first control value by estimating a slope of the frequency of the input signal using the current frequency control value and the number of previous frequency control values and multiplying it by a group delay of the low-pass filter.

15. A method for processing a sweeping signal component in an input signal, the method comprising:

receiving the input signal comprising a noise component and the sweeping signal component, mixing the input signal with a replica signal and therefrom providing a residual input signal, reducing the noise component by low-pass filtering the residual input signal and therefrom providing a filtered input signal, estimating a frequency error of the filtered input signal and therefrom providing an error signal, filtering the error signal and providing a frequency control value, generating the replica signal with a frequency adjusted according to the frequency control value, wherein the frequency of the replica signal represents an estimation of a frequency of the sweeping signal component propagated to a current time unit of the input signal.

16. The method according to claim 15, wherein the generating the replica signal comprises:

generating a frequency value using a current frequency control value, wherein the frequency value represents a current estimation of the frequency of the sweeping signal component, calculating a first control value using the current frequency control value and a number of previous frequency control values, wherein the first control value reflects a frequency offset between the frequency value and the frequency of the input signal at the current time unit of the input signal, adjusting the frequency based on a second control value, the second control value being a function of the first control value and the frequency value.

17. The method according to claim 16, wherein the current time unit of the input signal designates a sample of the input signal, which is currently received, and wherein the current frequency control value designates the frequency control value derived from said sample of the input signal.

18. The method according to claim 16, further comprising:

delaying the input signal according to a delay time of the low-pass filtering and therefrom providing a delayed input signal, filtering the delayed input signal based on the frequency value thereby reducing the sweeping signal component, and accordingly providing an output signal.

* * * * *